United States Patent
Marreiro et al.

(10) Patent No.: US 8,309,422 B2
(45) Date of Patent: Nov. 13, 2012

(54) LOW CLAMP VOLTAGE ESD METHOD

(75) Inventors: David D. Marreiro, Phoenix, AZ (US); Sudhama C. Shastri, Phoenix, AZ (US); Ali Salih, Mesa, AZ (US); Mingjiao Liu, Gilbert, AZ (US); John Michael Parsey, Jr., Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 261 days.

(21) Appl. No.: 12/890,878

(22) Filed: Sep. 27, 2010

(65) Prior Publication Data

US 2011/0021009 A1   Jan. 27, 2011

Related U.S. Application Data

(62) Division of application No. 12/170,630, filed on Jul. 10, 2008, now Pat. No. 7,842,969.

(51) Int. Cl.
*H01L 29/866* (2006.01)
(52) U.S. Cl. ........................................ 438/380; 257/603
(58) Field of Classification Search ................. 257/173, 257/603, 361, 106, E21.355; 438/110, 135, 438/143, 380
See application file for complete search history.

(56) References Cited

U.S. PATENT DOCUMENTS

| | | | |
|---|---|---|---|
| 5,631,484 A * | 5/1997 | Tsoi et al. | 257/341 |
| 5,880,511 A | 3/1999 | Yu et al. | |
| 5,990,511 A | 11/1999 | Leas | |
| 6,115,592 A | 9/2000 | Ueda et al. | |
| 6,121,669 A | 9/2000 | Kalb et al. | |
| 6,140,674 A | 10/2000 | Hause et al. | |
| 6,489,660 B1 | 12/2002 | Einthoven et al. | |
| 6,492,208 B1 * | 12/2002 | Cheng et al. | 438/133 |
| 6,504,209 B2 * | 1/2003 | Disney | 257/342 |
| 6,541,792 B1 | 4/2003 | Tran et al. | 257/50 |
| 6,822,295 B2 | 11/2004 | Larson | |
| 2003/0205775 A1 | 11/2003 | Einthoven et al. | |
| 2006/0181385 A1 | 8/2006 | Hurley | |
| 2007/0073807 A1 | 3/2007 | Bobde | |

OTHER PUBLICATIONS

Product Preview "NUF9300 5-Line EMI Filter with ESD Protection", Copyright Semiconductor Components Industries, LLC, 2005, Apr. 2005—Rev. P1, 6 pgs.
Data Sheet, Semtech, "Protection Products—MicroClampTM uClamp3301D Low Voltage μClampTM for ESD and CDE Protection", Revision Oct. 25, 2004, •Copyright 2004 Semtech Corp., 6 pgs.
Data Sheet, "RClamp0514M RailClamp Low Capacitance TVS Diode Array Protection Products", www.semtech.com—RailClamp, Revision Aug. 31, 2005, Copyright 2005 Semtech Corp., 11 pgs.
Data Sheet, "RClamp0522P RClamp0524P Ultra Low Capacitance TVS Arrays, Protection Products—RailClamp", www.semtech.com, Revision Sep. 19, 2006, Copyright 2006 Semtech Corp., 13 pgs.
Data Sheet, "RClamp0502B Ultra-Low Capacitance TVS for ESD and CDE Protection, Protection Products—RailClamp", Revision Apr. 5, 2005, Copyruight 2005 Semtech Corp., 9 pgs.

* cited by examiner

*Primary Examiner* — Nathan Ha
(74) *Attorney, Agent, or Firm* — Robert F. Hightower

(57) ABSTRACT

In one embodiment, an ESD device is configured to include a zener diode and a P-N diode and to have a conductor that provides a current path between the zener diode and the P-N diode.

9 Claims, 10 Drawing Sheets

US 8,309,422 B2

LOW CLAMP VOLTAGE ESD METHOD

CROSS-REFERENCE TO RELATED APPLICATIONS

The present application is a divisional application of prior U.S. application Ser. No. 12/170,630, filed on Jul. 10, 2008 now U.S. Pat. No. 7,842,969, which is hereby incorporated by reference, and priority thereto for common subject matter is hereby claimed.

This application is related to an application entitled "METHOD OF FORMING LOW CAPACITANCE ESD DEVICE AND STRUCTURE THEREFOR" having an application Ser. No. of 11/859,570, now U.S. Pat. No. 7,538,395, issued May 26, 2009,the divisional thereof having application Ser. No. 12/395076, filed on Feb. 27, 2009, a common assignee, and inventors Keena et al. This application is related to an application entitled "MULTI-CHANNEL ESD DEVICE AND METHOD THEREFOR" having an application Ser. No. of 11/859,624, now U.S. Pat. No. 7,579,632, issued Aug, 25, 2009, an a common assignee, and inventors Salih et al.

BACKGROUND OF THE INVENTION

The present invention relates, in general, to electronics, and more particularly, to methods of forming semiconductor devices and structures.

In the past, the semiconductor industry utilized various methods and structures to form electrostatic discharge (ESD) protection devices. According to one international specification, the International Electrotechnical Commission (IEC) specification commonly referred to as IEC 61000-4-2 (level 2) (the IEC has an address at 3, rue de Varembé, 1211 Genève 20, Switzerland), for an ESD event the peak voltage could be between two thousand and thirty thousand volts (2000-30000 V) and could occur over a period of a few nanoseconds, typically less than two nanoseconds (2 nsec.) and could last for only about one nanosecond (1 nsec.). An ESD device should respond to the ESD event within approximately 1 nanosecond. IEC specification IEC 61000-4-5 refers to a surge event as a current of about ten to twenty Amperes having a rise time of about eight micro-seconds and a fall time of about twenty micro-seconds. During the surge event, it is desired to limit the voltage drop across the device to a minimum value.

Some of the prior ESD devices used a zener diode and a P-N junction diode to attempt to provide ESD protection. In general, the prior ESD devices had to trade-off low capacitance against having a sharp breakdown voltage characteristic. The sharp breakdown voltage characteristic was needed to provide a low clamp voltage for the ESD device. In most cases, the device structures had a high capacitance, generally greater than about one to six (1-6) picofarads. The high capacitance limited the response time of the ESD device. Additionally, the devices generally had a clamp voltage during a surge event that was greater than desired.

Some prior ESD devices operated in a punch-through mode which required the devices to have a very thin and accurately controlled epitaxial layer, generally less than about 2 microns thick, and required a low doping in the epitaxial layer. These structures generally made it difficult to accurately control the clamping voltage of the ESD device and especially difficult to control low clamping voltages, such as voltages of less than about ten volts (10V). One example of such an ESD device was disclosed in U.S. Pat. No. 5,880,511 which issued on Mar. 9, 1999 to Bin Yu et al. Another ESD device utilized a body region of a vertical MOS transistor to form a zener diode at an interface with an underlying epitaxial layer. The doping profiles and depths used for the ESD device resulted in a high capacitance and a slow response time. Additionally, it was difficult to control the light doping levels in the thin layers which made it difficult to control the breakdown voltage of the ESD device. An example of such an ESD device was disclosed in United States patent publication number 2007/0073807 of inventor Madhur Bobde which was published on Mar. 29, 2007.

Accordingly, it is desirable to have an electrostatic discharge (ESD) device that has a low clamp voltage during a surge event, that has a low capacitance, that has a fast response time, that has a well controlled clamp voltage during a surge event, that is easy to control in manufacturing, and that has a clamp voltage that can be controlled to over a range of voltages from a low voltage to a high voltage.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor.

Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

Figure 1:
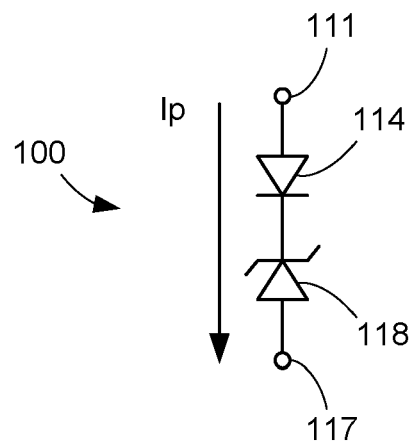
FIG. 1 schematically illustrates an embodiment of a portion of a circuit representation of an electro-static discharge (ESD) protection device in accordance with the present invention.

FIG. 1 schematically illustrates a circuit representation of an embodiment of a portion of an electrostatic discharge (ESD) protection device or ESD device 100 that has a very low clamp voltage in addition to having a very low capacitance. Device 100 includes two terminals, a first terminal 111 and a second terminal 117, and is configured to provide surge protection and ESD protection between terminals 111 and 117. Terminal 111 usually is an input terminal and terminal 117 usually is connected to a common reference potential such as a ground potential of the system in which device 100 is used. Terminal 111 usually is connected to another electronic element (not shown) that is to be protected by device 100. Device 100 is configured to have a very low clamp voltage between terminals 111 and 117 during a surge event and to have a low capacitance. The low capacitance assists in providing device 100 with a fast response time. In order to assist in providing the very low clamp voltage during the surge event, device 100 is formed to have a low resistance conduction path that is formed between terminals 111 and 117. Furthermore, device 100 is formed to have a sharp knee or sharp breakdown voltage characteristic that assists in accurately controlling the value of the clamp voltage. Device 100 includes a first diode 114 that has an anode connected to terminal 111. Device 100 also includes a zener diode 118 that has an anode connected to terminal 117 and a cathode connected to the cathode of diode 114.

If a surge event or an electrostatic discharge (ESD) event is received on terminal 111, terminal 111 is forced to a positive voltage relative to terminal 117. The positive voltage forward biases diode 114. As the voltage between terminals 111 and 117 reaches the positive threshold voltage of device 100 (the forward voltage of diode 114 plus the zener voltage of diode 118) a positive current (Ip) flows from terminal 111 through diode 114 to diode 118, and through diode 118 to terminal 117. Device 100 clamps the maximum voltage formed between terminals 111 and 117, thus the clamp voltage, to approximately the zener voltage of diode 118 plus the forward voltage of diode 114 plus the voltage drop through the conduction path between terminals 111 and 117. Device 100 is formed to minimize the resistance in the conduction path thereby reducing the value of the clamp voltage.

In normal operation, device 100 is biased to a normal operating voltage, such as a voltage that is between about one volt (1V) and approximately the zener voltage of diode 118, such as by applying about one volt (1V) to terminal 111 and a ground reference voltage to terminal 117. Because of the hereinafter described characteristics of device 100, the capacitance of device 100 remains low as the voltage between terminals 111 and 117 varies over this normal operating voltage. However, the capacitance of an ESD device is customarily specified with zero volts applied across the device. This zero voltage condition is normally referred to as a zero bias condition. As will be seen further hereinafter, at this zero bias condition the hereinafter described low capacitance features of device 100 forms a very low capacitance value for diode 114.

Figure 2:
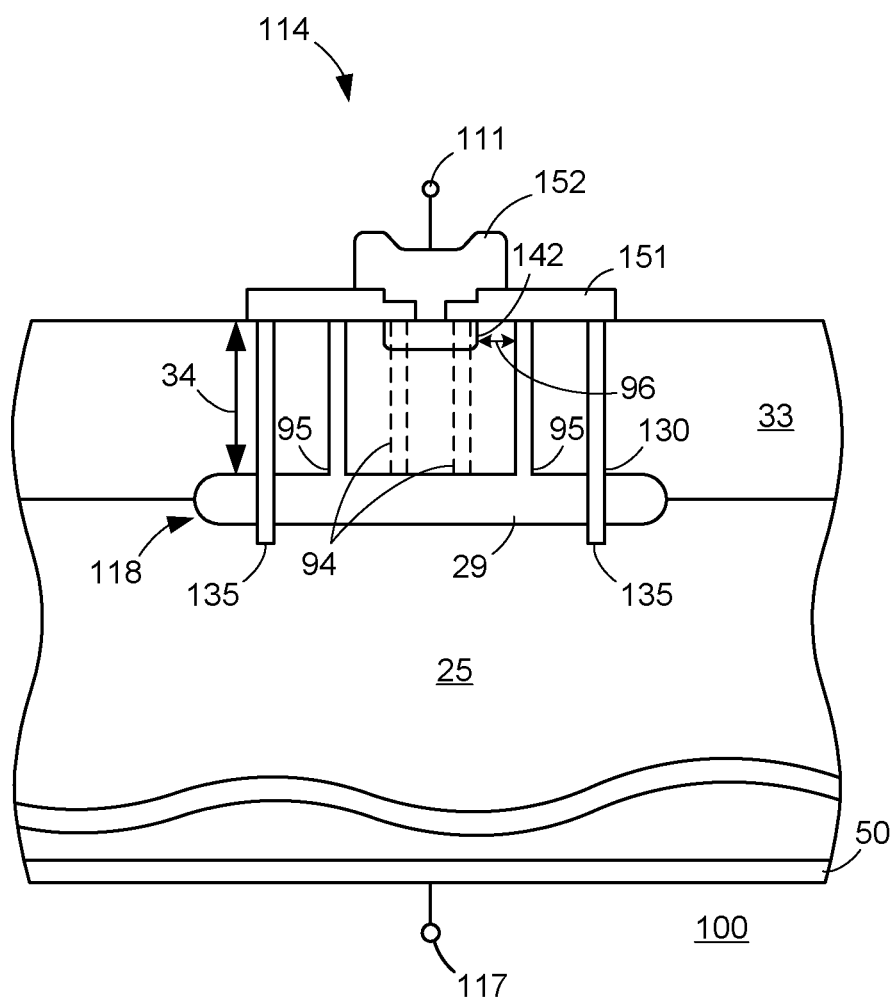
FIG. 2 illustrates an enlarged cross-sectional view of a portion of an embodiment of the ESD device of FIG. 1 in accordance with the present invention.

FIG. 2 illustrates an enlarged cross-sectional view of a portion of an embodiment of ESD device 100. Diodes 114 and 118 are identified in a general manner by arrows.

Diodes 114 and 118 are formed on a semiconductor substrate 25. A semiconductor layer 33 is formed on substrate 25, such as by epitaxial growth, and a portion of layer 33 may function as a drift region for diode 114. Terminal 117 usually is formed by forming a conductor 50, such as a metal, on the bottom surface of substrate 25 and providing a connection from conductor 50 to terminal 117.

Figure 3:
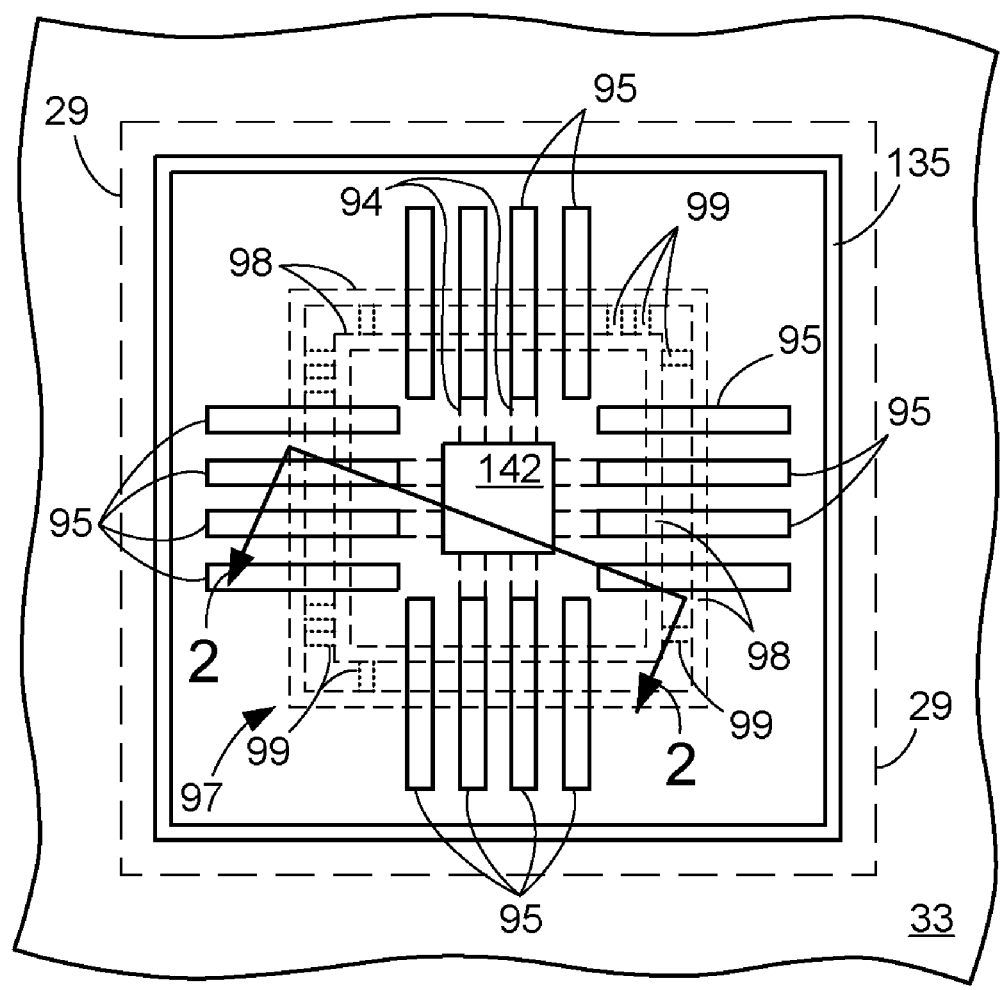
FIG. 3 illustrates an enlarged plan view of a portion of an embodiment of the ESD device of FIG. 2 in accordance with the present invention.

FIG. 3 illustrates an enlarged plan view of a portion of an embodiment of ESD device 100 prior to forming a conductor 152 and a dielectric 51. Region 29 of device 100 (FIG. 2) is illustrated in FIG. 3 by a dashed line because it underlies the portion of layer 33 shown in FIG. 2. FIG. 2 is a view across cross-section lines 2-2.

Figure 4:
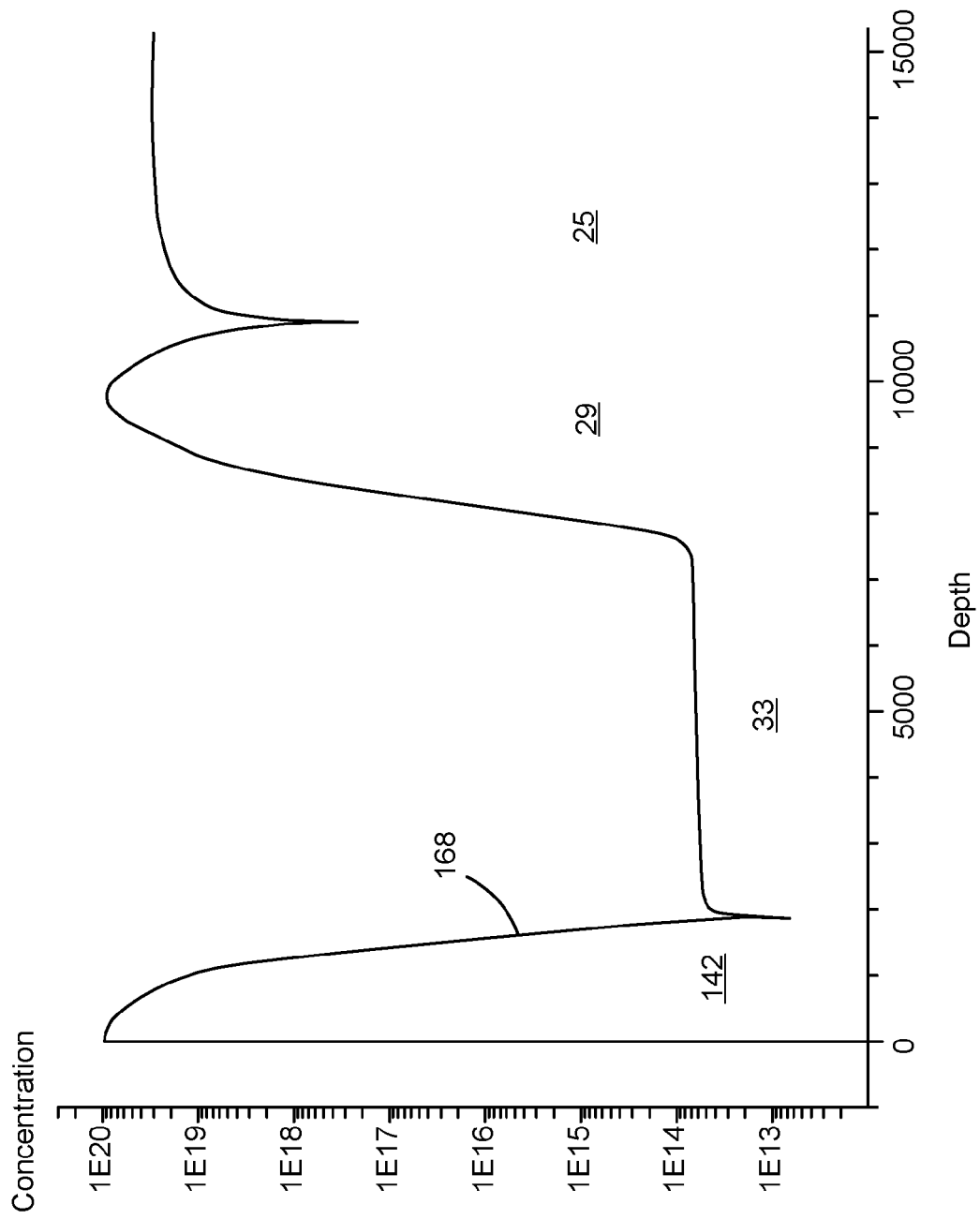
FIG. 4 is a graph illustrating some of the carrier concentrations of the ESD device of FIG. 1-FIG. 3 in accordance with the present invention.

FIG. 4 is a graph illustrating the carrier concentration profile of the preferred embodiment of device 100. The abscissa indicates depth from the surface of layer 33 into device 100 and the ordinate indicates increasing value of the carrier concentration. A plot 168 illustrates the carrier concentration of device 100 that results from a zero bias applied between terminals 111 and 117. This description has references to FIG. 1-FIG. 4.

Semiconductor region 29 is formed near the interface of the dopants that form layer 33 and the dopants of substrate 25 in order to form diode 118. In the preferred embodiment, substrate 25 is formed with a P-type conductivity having a doping concentration that is no less than approximately $1 \times 10^{19}$ atoms/cm$^3$ and preferably is between approximately $1 \times 10^{19}$ and $1 \times 10^{21}$ atoms/cm$^3$. In this preferred embodiment, semiconductor region 29 is formed as an N-type region having a peak doping concentration that is no less than approximately $1 \times 10^{19}$ atoms/cm$^3$ and preferably is between approximately $1 \times 10^{19}$ and $1 \times 10^{21}$ atoms/cm$^3$. Additionally, the thickness of region 29 generally is less than one micron and preferably is between about one to three (1-3) microns. Because of the small thickness of region 29 in addition to the high doping concentration of region 29 and substrate 25, when a positive voltage is formed between terminals 111 and 117, the voltage causes the carrier concentration to be confined to a small and high density area within region 29 and near to the interface with substrate 25. This high concentration of carriers and dopants provides zener diode 118 with a very sharp transition or knee and allows very accurate control over the breakdown voltage or zener voltage of diode 118. The breakdown voltage or zener voltage of diode 118 can be adjusted by changing the carrier concentration or carrier profile of region 29 and/or of substrate 25. This allows precisely controlling the breakdown voltage for specific applications such as for five or twelve or twenty-four volt (5V, 12V, 24V) breakdown voltage application.

Layer 33 preferably is formed to have a lower peak doping concentration that is at least one order of magnitude less than the doping concentration of region 29 and generally is between about $1 \times 10^{13}$ and $1 \times 10^{17}$ atoms/cm$^3$. Layer 33 and region 29 may be formed on substrate 25 by a variety of methods that are well known to those skilled in the art. For example, a thin N-type epitaxial layer, (not shown) may be formed on substrate 25 as a first portion of layer 33. This first portion may be doped to form region 29. Thereafter, the remainder of layer 33 may be formed.

Diode 114 includes a doped region 142 that is formed on the surface of layer 33 with the same conductivity as substrate 25. Region 142 is formed to extend into layer 33 and overlie region 29. A conductor 95, and preferably a plurality of conductors 95, is formed near region 142 to extend from the surface of layer 33, through layer 33, and to intersect region 29. As illustrated in FIG. 3, conductors 95 preferably are formed with a proximate end near to region 142 and to extend laterally across a portion of layer 33 overlying region 29. A distal end of conductors 95 usually is away from region 142 and preferably near the periphery of region 29. The proximate end of conductors 95 usually is spaced from region 142 by a distance 96 that preferably is no greater than a thickness 34 of layer 33. Thickness 34 is measured between region 29 and the surface of layer 33. Thickness 34 separates region 142 from region 29 by a distance that assists in minimizing the capacitance of diode 114. The portion of layer 33 that is between region 142 and 29 forms a drift region of diode 114. Thickness 34 usually is approximately two to twenty (2-20) microns and preferably is about seven (7) microns, and thickness 34 generally is at least around two microns in order to minimize the capacitance of device 100, to reduce the formation of parasitic transistors, and to ensure that device 100 does not operate in a punch-through operating region. Distance 96 preferably is no greater than thickness 34 and in one embodiment is less than seven (7) microns. Conductors 95 generally are formed by making an opening that extends from the surface through layer 33 to expose a portion of region 29. Thereafter, the opening is filled with a conductor, such as doped polysilicon, in order to form conductors 95. If conductors 95 are formed from doped semiconductor material, the material has the same conductivity as layer 33. The resistivity of the material used to form conductors 95 is less than the resistivity of the material of layer 33 and usually is significantly less than the resistivity of the material of layer 33. In the preferred embodiment, conductors 95 are formed from N-type doped polysilicon having a doping concentration that is no less than approximately $1 \times 10^{19}$ atoms/cm$^3$ and preferably is between approximately $1 \times 10^{19}$ and $1 \times 10^{21}$ atoms/cm$^3$.

During a surge event, current Ip flows from terminal 111 through the P-N junction formed between region 142 and layer 33 and into the drift region of layer 33. The lower doping concentration of layer 33 assists in reducing the capacitance of device 100, but, it also forms a higher resistance conduction path from diode 114 to diode 118. The low resistivity of conductors 95 forms a low resistance conduction path that allows the current to flow from layer 33 into conductors 95 and to region 29. The lower resistivity of conductors 95 minimizes the resistance in the conduction path between terminals 111 and 117 and forms a lower voltage drop than would be formed if the current flowed through the higher resistance of layer 33. If distance 96 were significantly greater than thickness 34, the path from region 142 to conductor 95 would form a resistance that is greater than the distance of thickness 34, so the current would not flow through conductors 95. Those skilled in the art will appreciate that distance 96 may be greater than thickness 34 and still provide a reduced resistance. It is believed that distance 96 can be up to fifty percent (50%) greater than thickness 34 and still provide some reduced resistance although forming distance 96 to be no greater than thickness 34 is more effective in reducing the resistance. Keeping distance 96 less than thickness 34 facilitates forming the low resistance conduction path. Using a plurality of conductors 95 as illustrated in FIG. 3 forms a plurality of parallel low resistance conduction paths that facilitate conducting a large current. Thus, conductors 95 reduce the clamp voltage of device 100 during a surge event by lowering the voltage drop in the conduction path of device 100, thereby, lowering the voltage drop across device 100, thus, the clamp voltage of device 100. In the preferred embodiment, the resistance of the conduction path formed by conductors 95 is less than about 0.1 ohms, and the resulting voltage drop during a surge event is generally less than about two volts (2V). It is believed that the resistivity of this low resistance conduction path is about one tenth (0.1) the resistivity of prior art devices.

An optional isolation trench 135 may be formed in order to isolate the portion of layer 33 where diode 114 and conductors 95 are formed from other portions of layer 33. Trenches 135 are omitted in the preferred embodiment. In some cases, trench 135 reduces the capacitance of diode 114 by reducing the amount of layer 33 that is near region 142. Trench 135 generally is formed by creating openings from a top surface of layer 33, through layer 33, and extending into substrate 25. Trench 135 may also extend through region 29 a distance into substrate 25 in order to prevent conduction laterally through region 29. Trench 135 is provided with isolation such as by forming a dielectric liner 130 along the sidewalls and bottoms of trench 135 and filling the remaining of the opening with a dielectric or with doped or undoped polysilicon.

Alternately, dielectric liner 130 may be formed along the sidewalls but not the bottom of trench 135 and the remainder of the opening may be filled with a dielectric or with a material that has the conductivity and doping of substrate 25. The lined sidewalls prevent forming a P-N junction between trench 135 and layer 33 because such a junction would increase the capacitance of device 100. Methods to form trench 135 are well known to those skilled in the art. Trench 135 preferably is formed as a closed polygon with a periphery that has an opening which encloses a portion of layer 33, thus, trench 135 may be regarded as a multiply-connected domain. Preferably, trench 135 is one continuous trench that is formed to enclose region 142 and conductors 95.

The peak doping concentration of region 142 generally is greater than the peak doping concentration of layer 33 and preferably is approximately equal to the peak doping concentration of substrate 25. Region 142 generally is formed to extend a distance no greater than about two (2) microns and preferably about one tenth to two (0.1-2) microns from the surface into layer 33. The large differential doping concentration between region 142 and layer 33 and the shallow depth of region 142 assists in providing diode 114 with a very small zero bias capacitance. This very small zero bias capacitance of diode 114 assists in forming a small zero bias capacitance for device 100 as indicated hereinbefore. The capacitance of device 100 at zero bias generally is less than about 0.4 picofarads and preferably is no greater than about 0.2 picofarads.

Subsequently, a dielectric 151 may be formed on the surface of layer 33. An opening generally is formed through dielectric 151 to expose portions of regions 142. A conductor 152 may be applied to make electrical contact to region 142. Conductor 152 usually is subsequently connected to terminal 111.

Referring to FIG. 2 and FIG. 3, the closer conductors 95 are to region 142, the more of current Ip that flows through conductors 95 instead of layer 33, thus, the lower the resistance of the conduction path and the lower the clamp voltage of device 100. Thus, reducing distance 96 further reduces the resistance in the conduction path, thereby reducing the clamp voltage, of device 100 without substantially increasing the capacitance. It is believed that the optimum tradeoff between low capacitance and low clamp voltage occurs for distance 96 just less than thickness 34. Conductors 95 may even be formed to intersect region 142 as illustrated by the dash lines referenced as 94 in FIG. 2. Forming conductors 95 to intersect region 142 maximizes the amount of current Ip that flows through conductors 95 thereby minimizing the conduction resistance and minimizes the clamp voltage. Dashed lines 94 in FIG. 3 illustrate conductors 95 extending to intersect region 142. Those skilled in the art will appreciate that in the case of conductors 95 intersecting region 142, P-N junctions are formed between region 142 and each of conductors 95. This P-N junction does not affect the operation of device 100 or the very low clamp voltage. Forming conductors 95 intersecting region 142 may increase the capacitance of device 100. For the embodiment where conductors 95 intersect region 142, it is important for dielectric 51 to cover conductors 95 (dashed lines 94) and electrically isolate them from conductor 152.

Optionally, a conductor lattice 97 (FIG. 3) may be formed intersecting conductors 95. One example of lattice 97 is illustrated in a general manner by an arrow. Lattice 97 usually includes a conductor 98, and preferably a plurality of conductors 98, that are formed similarly to conductors 95 except that conductor 98 are formed to intersect with a plurality of conductors 95 to interconnect at least a portion of conductors 95 together. Also, optional conductors 99 may be formed to intersect with at least a portion of conductors 98 to interconnect a portion of conductors 98 together. Conductors 98 and 99 are formed in a manner similar to conductors 95. In one embodiment, conductors 98 are formed to extend around region 142 and intersect perpendicularly to conductors 95. In this embodiment, conductors 99 are formed perpendicular to conductors 98. Conductors 98 and 99 further increase the conduction paths for the current through device 100 thereby further reducing the resistance in the conduction path of device 100. Those skilled in the art will appreciate that conductors 98 and 99 may have other geometric configurations as long as they further increase the conduction paths through device 100 so that the conduction paths are electrically in parallel with conductors 95. Although conductors 95 are illustrated as straight-line elements, those skilled in the art will appreciate that conductors 95 may have any shape as long as they lower the resistance of device 100, increase the number of parallel conduction paths through device 100, and reduce the clamp voltage of device 100.

Figure 5:
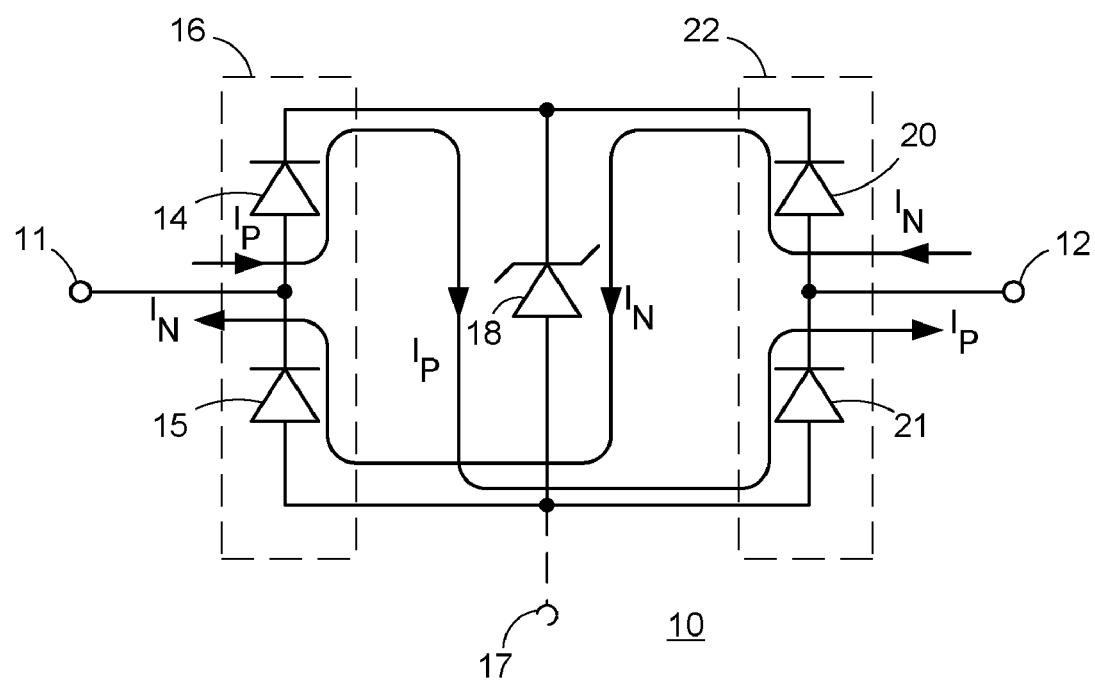
FIG. 5 schematically illustrates an embodiment of a portion of a circuit representation of another electrostatic discharge (ESD) protection device in accordance with the present invention.

Referring to FIG. 5, conductors 95 may be used in a variety of ESD device configurations in order to reduce the clamp voltage thereof, including multi-channel ESD devices. FIG. 5 schematically illustrates a circuit representation of an embodiment of a portion of an ESD device 10 that is an alternate embodiment of device 100 that was explained in the description of FIG. 1-FIG. 4. Device 10 is formed to have a very low clamp voltage and low capacitance. Device 10 includes two input/output (I/O) terminals, a first terminal 11 and a second terminal 12, and is configured to provide bidirectional ESD protection between terminals 11 and 12. Either of terminals 11 and 12 can be an input terminal or an output terminal. The output terminal usually is connected to another element (not shown) that is to be protected by device 10. For example, terminal 12 may be used as the output terminal and connected to the high side of a regulated power supply (such as a 5V supply). Device 10 is configured to have a very low clamp voltage and a low capacitance between terminals 11 and 12. Furthermore, device 10 is formed to have a sharp knee or sharp breakdown voltage characteristic that assists in accurately controlling the value of the clamp voltage. The low capacitance assists in providing device 10 with a fast response time. In order to assist in providing the very low clamp voltage during a surge event, device 10 is formed to have a low resistance conduction path that is formed between terminals 11 and 12. Device 10 includes a plurality of steering diode channels that includes a first steering diode channel 16 and a second steering diode channel 22. Channel 16 includes a first steering diode 14 that has an anode commonly connected to terminal 11 and to a cathode of a second steering diode 15. Channel 22 includes a third steering diode 20 that has an anode commonly connected to terminal 12 and to a cathode of a fourth steering diode 21. Diodes 14, 15, 20, and 21 are formed as P-N junction diodes that have a low capacitance. A zener diode 18 is connected in parallel with each of channels 16 and 22. Diode 18 has an anode connected to the anode of diodes 15 and 21, and a cathode connected to the cathode of diodes 14 and 20.

If a positive surge event or ESD event is received on terminal 11, terminal 11 is forced to a positive voltage relative to terminal 12. The positive voltage forward biases diodes 14 and 21 and reverse biases diode 18 in addition to diodes 15 and 20. As the voltage between terminals 11 and 12 reaches the positive threshold voltage of device 10 (the forward voltage of diodes 14 and 21 plus the zener voltage of diode 18) a positive current (Ip) flows from terminal 11 through diode 14 to diode 18, and through diodes 18 and 21 to terminal 12. Device 10 forms the clamp voltage between terminals 11 and 12 to approximately the zener voltage of diode 18 plus the forward voltage of diodes 14 and 21 plus the voltage drop across the resistance of the conduction path between terminals 11 and 12. If a negative surge event or ESD event is received on terminal 11, terminal 11 is forced to a negative voltage relative to terminal 12. The negative voltage forward biases diodes 20 and 15, and reverse biases diode 18 in addition to diodes 14 and 21. As the voltage between terminals 11 and 12 reaches the negative threshold voltage of device 10 (the forward voltage of diodes 20 and 15 plus the zener voltage of diode 18) a negative current (In) flows from terminal 12 through diode 20 to diode 18, and through diodes 18 and 15 to terminal 11. The sharp knee of diode 18 causes device 10 to rapidly form the clamp voltage between terminals 11 and 12 to the zener voltage of diode 18 plus the forward voltage of diodes 15 and 20 plus the voltage drop across the resistance of the conduction path between terminals 11 and 12.

In normal operation, device 10 is biased to a normal operating voltage, such as a voltage that is between about one volt (1V) and the zener voltage of diode 18, such as by applying about one volt (1V) to terminal 11 and a ground reference voltage to terminal 12. Because of the hereinafter described characteristics of device 10, the capacitance of device 10 remains low as the voltage between terminals 11 and 12 varies over this normal operating voltage. However, the capacitance of an ESD device is customarily specified with zero volts applied across the device. This zero voltage condition is normally referred to as a zero bias condition. As will be seen further hereinafter, at this zero bias condition the hereinafter described low capacitance features of device 10 forms very low capacitance values for diodes 14, 15, 20, and 21. Since there are two parallel paths between terminals 11 and 12, the capacitance value of each path is the additive product of the capacitances in each path. The first path includes the capacitances of diodes 14, 18 and 21 in series. Since the capacitance of capacitors in series is smaller than that of the smallest capacitor, then the capacitance of the first path is smaller than the capacitance of either of diodes 14, 18, or 21. Device 10 is formed so that the zero bias capacitance of diodes 14 and 21 are very small as will be seen further hereinafter. Similarly, the capacitance of the second path, that includes diodes 20, 18 and 15, is also very small. The overall additive value of the two paths forms a small zero bias capacitance for device 10.

Figure 6:
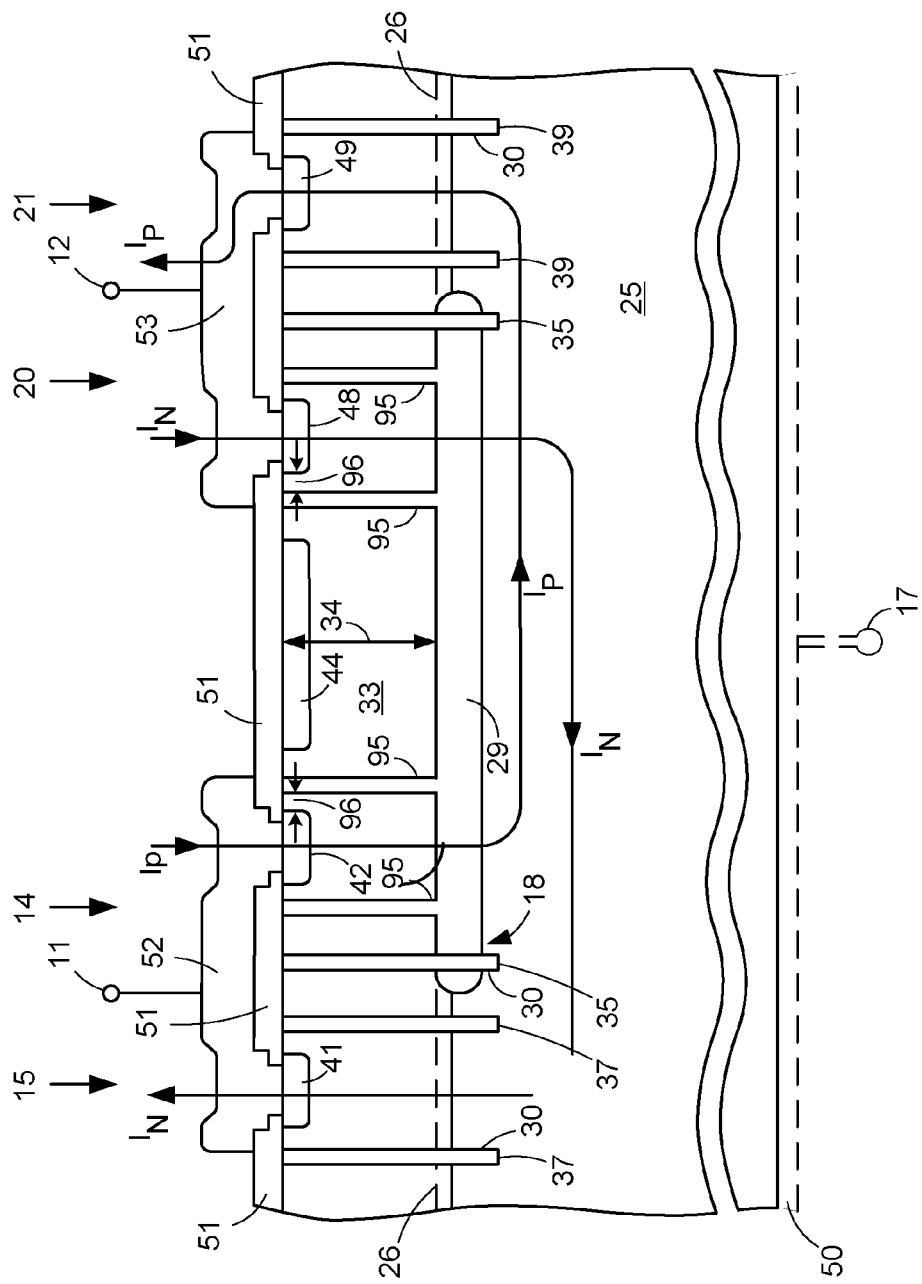
FIG. 6 illustrates an enlarged cross-sectional view of a portion of an embodiment of the ESD device of FIG. 5 in accordance with the present invention.

FIG. 6 illustrates an enlarged cross-sectional view of a portion of an embodiment of device 10. Diodes 14, 15, 20, 21, and 18 are identified in a general manner by arrows. Diodes 14, 15, 20, 21, and 18 are formed on semiconductor substrate 25.

Figure 7:
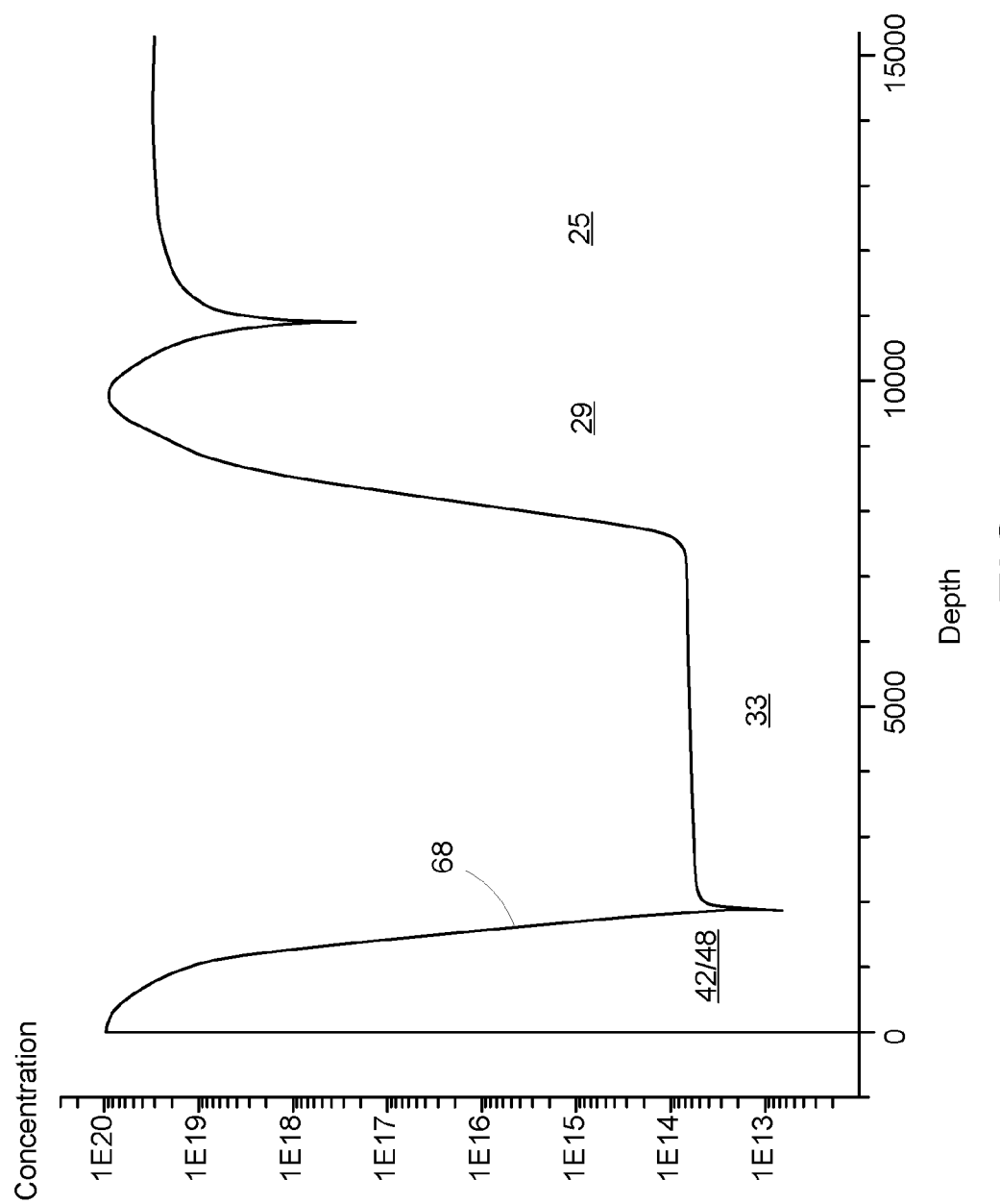
FIG. 7 is a graph illustrating some of the carrier concentrations of the ESD device of FIG. 5 and FIG. 6 in accordance with the present invention.

FIG. 7 is a graph illustrating the zero bias carrier concentration profile of the preferred embodiment of device 10. The abscissa indicates depth from the surface of layer 33 into device 10 and the ordinate indicates increasing value of the carrier concentration. A plot 68 illustrates the carrier concentration of device 10 that results from a positive bias applied from terminal 11 to terminal 12 (such as by a positive ESD event). Plot 68 is similar to plot 168 illustrated in FIG. 4. This description has references to FIG. 6 and FIG. 7.

Semiconductor region 29 is formed near the interface of the dopants that form layer 33 and the dopants of substrate 25 in order to form diode 18. Layer 33 is formed as explained hereinbefore. Subsequently, isolation trenches 35, 37, and 39 may be formed in order to isolate the portion of layer 33 where diodes 14 and 20 are to be formed from the portion of layer 33 where diodes 15 and 21 are to be formed. Trenches 35, 37, and 39 generally are formed by creating openings from a top surface of layer 33, through layer 33, and extending into substrate 25. Trench 35 also extends through region 29 a distance into substrate 25 in order to prevent conduction laterally through region 29 between diode 18 and either of diodes 15 or 21. Trenches 35, 37, and 39 are provided with isolation such as by forming a dielectric liner 30 along the sidewalls and bottoms of trenches 35, 37, and 39 and filling the remaining opening with a dielectric or with doped or undoped polysilicon. Alternately, dielectric liner 30 may be formed along the sidewalls but not the bottom of trenches 35, 37, and 39, and the remainder of the opening may be filled with a dielectric or with a material that has the conductivity and doping of substrate 25. Methods to form trenches 35, 37, and 39 are well known to those skilled in the art. Because trench 35 extends through region 29, it reduces alignment tolerances and makes it easier to reliably produce device 10. Trench 35 preferably is formed as a closed polygon with a periphery that has an opening which encloses a portion of layer 33, thus, trench 35 may be regarded as a multiply-connected domain. Similarly, each of trenches 37 and 39 may be regarded as a multiply-connected domain. Each of trenches 35, 37, and 39 may be viewed as a blocking structure that minimizes electrical coupling between the enclosed portions and other portions of device 10.

Diode 14 includes a doped region 42 that is formed on the surface of layer 33 with the same conductivity as substrate 25. Region 42 is similar to region 142 explained in the description of FIG. 1-FIG. 4. Similarly, diode 20 includes a doped region 48 that is formed on the surface of layer 33 with the same conductivity as substrate 25. Region 48 is similar to region 42.

Regions 42 and 48 are formed to extend into layer 33 and overlie region 29. Regions 42 and 48 generally are separated from region 29 by a distance that assists in minimizing the capacitance of diodes 15 and 21. The spacing generally is approximately two to twenty (2-20) microns. The portion of layer 33 that is between regions 42 and 29 and between regions 48 and 29 forms a drift region of respective diodes 14 and 20. Thickness 34 of layer 33 generally is at least around two microns in order to reduce the formation of parasitic transistors, and to ensure that device 10 does not operate in a punch-through operating region.

Two sets of conductors 95 are formed with one set near region 42 and another set near region 48. Conductors 95 are formed to extend from the surface of layer 33, through layer 33, and to intersect region 29. Referring to FIG. 3 and FIG. 6, conductors 95 of the two sets preferably are formed with a proximate end near to associated regions 42 and 48 and to extend laterally across layer 33 overlying region 29. A distal end of the two sets of conductors 95 preferably is away from associated regions 42 and 48. The proximate end of the two sets of conductors 95 usually is spaced from associated regions 42 and 48 by distance 96. The portion of layer 33 that is between region 29 and regions 42 and 48 forms a drift region of diodes 14 and 20. Conductors 95 of the set of conductors near region 42 reduce the resistance of the conduction path from region 42 to region 29, thus between diodes 14 and 18, and conductors 95 of the set of conductors near region 48 reduce the resistance of the conduction path from region 48 to region 29, thus between diodes 20 and 18.

Regions 42 and 48 and conductors 95 usually are positioned to be completely surrounded by trench 35. Preferably, trench 35 is one continuous trench. Because trench 35 extends through layer 33, it reduces the amount of layer 33 that is near regions 42 and 48 thereby assisting in reducing the capacitance of diodes 14 and 20. The peak doping concentration of regions 42 and 48 generally is greater than the peak doping concentration of layer 33 and preferably is approximately equal to the peak doping concentration of substrate 25. Regions 42 and 48 generally are formed to extend a distance no greater than about two (2) microns and preferably about one tenth to two (0.1-2) microns from the surface into layer 33. The large differential doping concentration between region 42 and layer 33 and also between region 48 and layer 33 and the shallow depth of regions 42 and 48 assists in providing respective diodes 14 and 20 with a very small zero bias capacitance. This very small zero bias capacitance of diodes 14 and 20 assists in forming a small zero bias capacitance for device 10 as indicated hereinbefore. The capacitance of each of diodes 14, 18, and 20 at zero bias generally is less than about 0.4 picofarads and the equivalent series capacitance of diodes 14, 18, and 20 forms a capacitance for device 10 that is about 0.2 picofarads and preferably is no greater than about 0.01 picofarads.

A doped region 49 is formed in layer 33 with the opposite conductivity to substrate 25 in order to form diode 21. Similarly, a doped region 41 is formed in layer 33 with the opposite conductivity to substrate 25 in order to form diode 15. Regions 41 and 49 are formed on the surface of layer 33 and preferably extend approximately the same distance into layer 33 as regions 42 and 48. However, regions 41 and 49 do not overlie region 29. Region 41 is positioned so that the periphery of region 41, such as the periphery at the surface of layer 33, is completely surrounded by trench 37 and region 49 is positioned so that the periphery of region 49, such as the periphery at the surface of layer 33, is completely surrounded by trench 39. Each of trenches 37 and 39 preferably are formed as one continuous trench. Because trenches 37 and 38 extend through layer 33, they restrict the amount of layer 33 that is near respective regions 41 and 49 thereby assisting in reducing the capacitance of respective diodes 15 and 21. In the preferred embodiment, regions 41 and 49 have a peak doping concentration that is greater than the peak doping concentration of layer 33 and preferably is approximately equal to the peak doping concentration of substrate 25.

An optional doped region 44 may be formed in layer 33 with the opposite conductivity to substrate 25. Region 44 usually is formed to overlie region 29 and positioned between conductors 95 that are associated with regions 42 and 48, thus, region 44 is within the multiply-connected domain formed by trench 35. Region 44 preferably extends approximately the same distance into layer 33 as regions 42 and 48. Region 44 functions as a channel stop that assists in preventing the formation of an inversion channel near the surface of layer 33 between diodes 14 and 20. Additionally, the high differential doping concentration between region 44 and layer 33 assists in preventing the formation of a parasitic bipolar transistor between region 42, layer 33, and region 48. In some embodiments where the differential doping concentration does not form such a parasitic bipolar transistors, region 44 may be omitted. As can be seen, device 10 usually is devoid of a doped region having a conductivity that is the same as substrate 25 and that is positioned between diode 14 and region 29, thus between regions 42 and 29.

Subsequently, a dielectric 51 may be formed on the surface of layer 33. Openings generally are formed through dielectric 51 to expose portions of regions 41, 42, 48, and 49. A conductor 52 may be applied to make electrical contact to both regions 41 and 42. A conductor 53 may be applied to make electrical contact to both regions 48 and 49. Conductors 52 and 53 usually are subsequently connected to respective terminals 11 and 12. Since the ESD current flow of device 10 is not through the bottom surface of substrate 25, a conductor generally is not applied thereto.

When device 10 receives a positive surge event or a positive ESD voltage on terminal 11 relative to terminal 12, diodes 14 and 21 are forward biased and diodes 15 and 20 are reverse biased. Because of the depletion regions, the carrier density in layer 33 is further reduced from the zero bias condition (plot 68) which assists in further reducing the capacitance of device 10. The capacitance of device 10 at zero bias generally is less than about 0.4 picofarads and the equivalent series capacitance for device 10 is about 0.2 picofarads and preferably is no greater than about 0.1 picofarads.

When device 10 receives a negative voltage on terminal 11 relative to terminal 12, diodes 20 and 15 are forward biased and diodes 14 and 21 are reverse biased. Because of the depletion regions, the carrier density in layer 33 is further reduced from the zero bias condition which assists in further reducing the capacitance of device 10. Note that for both of the ESD discharge events, the ESD current flow is into and out of the top surface of substrate 25 and layer 33. The ESD current does not flow through the bottom surface of substrate 25, thus, the bottom surface of substrate 25 generally has a floating potential.

In another embodiment, device 10 also includes a third terminal 17 (illustrated in FIG. 5 by dashed lines). In most applications that would use this embodiment of device 10, terminal 17 would be connected to a ground reference potential of the system in which device 10 is used. This three terminal configuration provides protection between terminals 11 and 12, between terminals 11 and 17, and between terminals 12 and 17 for large voltages received on either of terminals 11 or 12. Referring again to FIG. 6, terminal 17 is formed by forming a conductor 50 (illustrated by dashed lines), such as a metal, to the bottom surface of substrate 25 and providing a connection from conductor 50 to terminal 17.

When an electrostatic discharge occurs, there is generally a large voltage and current spike that occurs over a brief period of time. Generally, the peak current and peak voltage occurs over a period of a few nanoseconds, typically less than two nanoseconds (2 nsec.) and could last for only about one nanosecond (1 nsec.). The current generally decreases to a plateau for another time interval usually around twenty (20) nanoseconds and slowly decreases over another twenty to forty (20-40) nanoseconds. The peak value of the current could be between one to thirty amperes (1 to 30 amps) and the peak voltage could be between two thousand and thirty thousand volts (2000-30000 V). The size and response time of the elements of device 10 preferably are configured to respond to the voltage during the time interval of the peak voltage and conduct the peak current. During an ESD event between terminals 11 and 12, either of diodes 14 and 21 are connected in series and diodes 15 and 20 are connected in series, the effective capacitance is the total series capacitance. Because capacitors in series result in a capacitance that is less than the smallest capacitance, the low capacitance ensures that the capacitance of device 10 is low enough for device 10 to respond to the ESD event and conduct the ESD current during the peak ESD voltage and current. The response to a transient ESD event also is dependent on parasitic resistance and inductance of the ESD device and also of the circuit/system in which the ESD device is installed.

Figure 8:
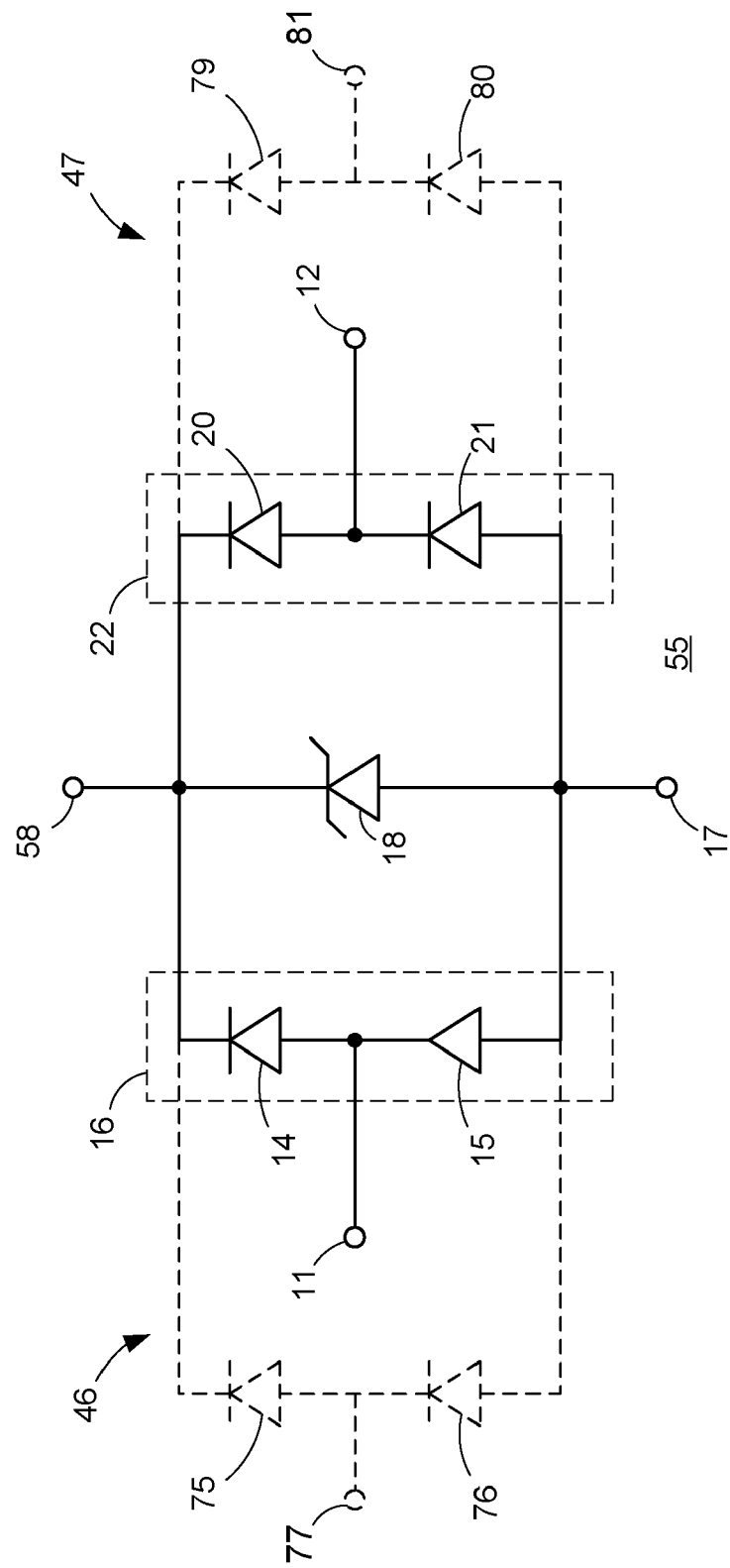
FIG. 8 schematically illustrates an embodiment of a portion of a circuit representation of a still another electrostatic discharge (ESD) protection device in accordance with the present invention.

FIG. 8 schematically illustrates an embodiment of a portion of a circuit representation of an ESD device 55 that is an alternate embodiment of device 10 that was described in the description of FIG. 5-FIG. 7. The circuit schematic of device 55 is similar to the circuit schematic of device 10 except that device 55 includes terminal 17 and has a fourth terminal 58 that is connected to the cathode of diode 18. Additionally, those skilled in the art will understand that device 55, and also device 10, may include additional channels such as another channel 46 in parallel with channel 16 and another channel 47 in parallel with channel 22. Channel 46 includes series connected P-N diodes 75 and 76 that have a terminal 77 connected to a common node of diodes 75 and 76. Also, channel 47 includes series connected P-N diodes 79 and 80 that have a terminal 81 connected to a common node of diodes 79 and 80. In an application that uses device 55, terminal 58 usually is connected to the voltage rail of a power supply and terminal 17 is connected to the common reference potential. Terminals 11 and 12 provide ESD protection for signals that are passed through terminals 11 and 12.

Figure 9:
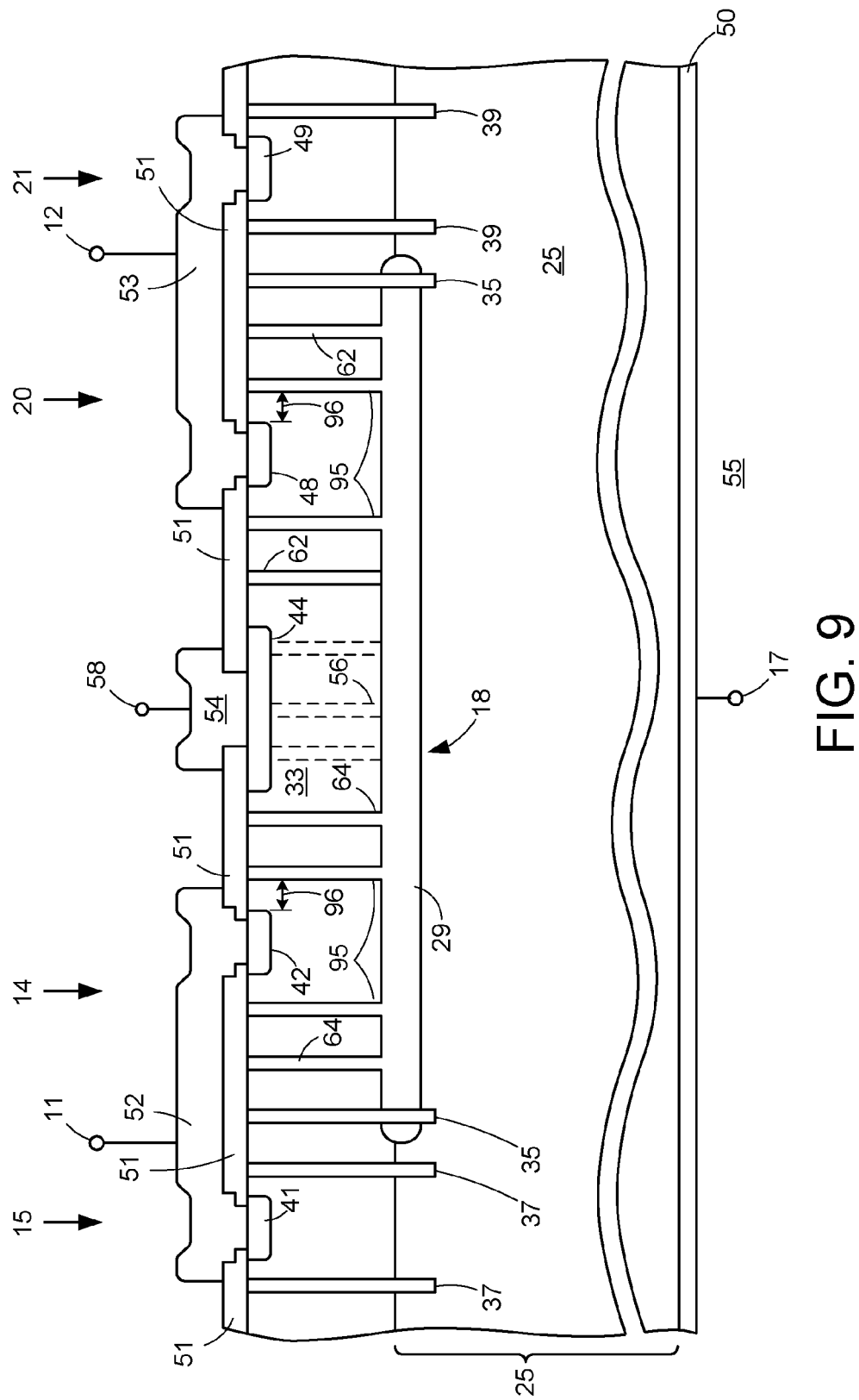
FIG. 9 illustrates an enlarged cross-sectional portion of an embodiment of the ESD device of FIG. 8 in accordance with the present invention.

FIG. 9 illustrates an enlarged cross-sectional view of a portion of an embodiment of device 55. The cross-section of device 55 is similar to the cross-section of device 10 except that device 55 includes a conductor 54 that is connected to terminal 58, and further includes conductors 62 and 64. For the embodiment illustrated in FIG. 5, region 44 is not optional and is utilized to provide conductor 54 a low resistance electrical connection to layer 33. The low resistance electrical connection facilitates connecting terminal 58 to the cathode of diode 18.

It is desirable to form diodes 14 and 20 to have substantially equal capacitance values. In some cases, a mild inversion layer may form near the surface of layer 33 between regions 44 and 48 and between regions 44 and 42.

Such an inversion layer could affect the capacitance of diodes 14 and 20. Conductors 62 and 64 assist in minimizing disturbances in the capacitance values of diodes 14 and 20 so that the values are more equally matched. Each of conductors 62 and 64 may be viewed as a blocking structure that minimizes electrical coupling between the enclosed portions and other portions of device 10. Conductor 62 is formed to extend from the surface of layer 33, through layer 33, and intersect region 29. The periphery of conductor 62 generally forms a closed polygon that encloses a portion of layer 33. Region 48 and conductors 95 that are associated with region 48 are positioned within the portion of layer 33 that is enclosed by conductor 62. Conductor 62 generally is positioned further away from region 48 than conductors 95. Conductor 64 is also formed to extend from the surface of layer 33, through layer 33, and intersect region 29. The periphery of conductor 64 generally forms a closed polygon that encloses another portion of layer 33. Region 42 and conductors 95 that are associated with region 42 are positioned within the portion of layer 33 that is enclosed by conductor 64. Conductor 62 generally is positioned further away from region 48 than conductors 95 in order to prevent increasing the capacitance of region 42, thus of diode 14. Each of conductors 62 and 64 may be considered a separate multiply-connected domain. Conductors 62 and 64 generally are formed by making an opening that extends from the surface through layer 33 to expose a portion of region 29. Thereafter, the opening is filled with a conductor, such as doped polysilicon, in order to form conductors 62 and 64. In the case of using a doped semiconductor material, the material has the same conductivity as layer 33 in order to prevent forming a P-N junction between layer 33 and either of conductors 62 or 64, because such a junction could increase the capacitance of device 55.

In another embodiment, the openings in which conductors 62 and 64 are formed may have a dielectric liner on the sidewalls but not on the bottom. Omitting the liner on the bottom facilitates forming electrical connection to region 29. In yet another embodiment, conductors 62 and 64 may be replaced with an isolation trench such as trench 35. However, such an isolation trench would extend to the surface of region 29 but would not extend through region 29 in order to allow conduction through region 29. Those skilled in the art will appreciate that conductors 62 and 64 may be added to device 10 of FIG. 5 and FIG. 6.

Although P-N diodes 75, 76, 79, and 80 are not illustrated in FIG. 9, those skilled in the art will appreciate that diodes 75 and 79 should be formed as doped regions overlying region 29 similar to respective diodes 14 and 20 and corresponding regions 42 and 48. The doped regions of diodes 75 and 79 generally would be enclosed by trenches 35. In order to form diodes 75 and 79, region 29 may be made larger, such as extended in a direction that would be perpendicular to the page shown in FIG. 5. Alternately, another region similar to region 29 may be formed on substrate 25 and electrically connected to region 29. Thus, region 29 or the additional region that is similar to region 29 would electrically connect the cathodes of diodes 75 and 79 to the cathode of diode 18. Diodes 76 and 80 would be formed in layer 33 and not overlying region 29. Each of the doped regions used for diodes 76 and 80 should be within a closed polygon that is formed by a trench similar to either of trenches 37 or 39. Thus, the anode of diodes 76 and 80 would be connected to the anode of diode 18 by substrate 25.

In another alternate embodiment, a plurality of conductors 56 may be formed to extend from region 44, through layer 33, and intersect with region 29. Because conductors 56 are optional, they are illustrated by dashed lines in FIG. 9. Conductors 56 reduce the resistance of the connection between conductor 54 and the cathode of diode 18. Those skilled in the art will appreciate that conductors 56 can provide reduced resistance without extending entirely through layer 33 to region 29. Generally, conductors 56 should extend at least one-half of the distance from the surface of layer 33 toward region 29 and may extend further up to a distance that touches region 29. Conductors 56 generally are formed in a manner similar to conductors 62 and 64. Those skilled in the art will appreciate that conductors 62 and 64 may be omitted from device 55.

Figure 10:
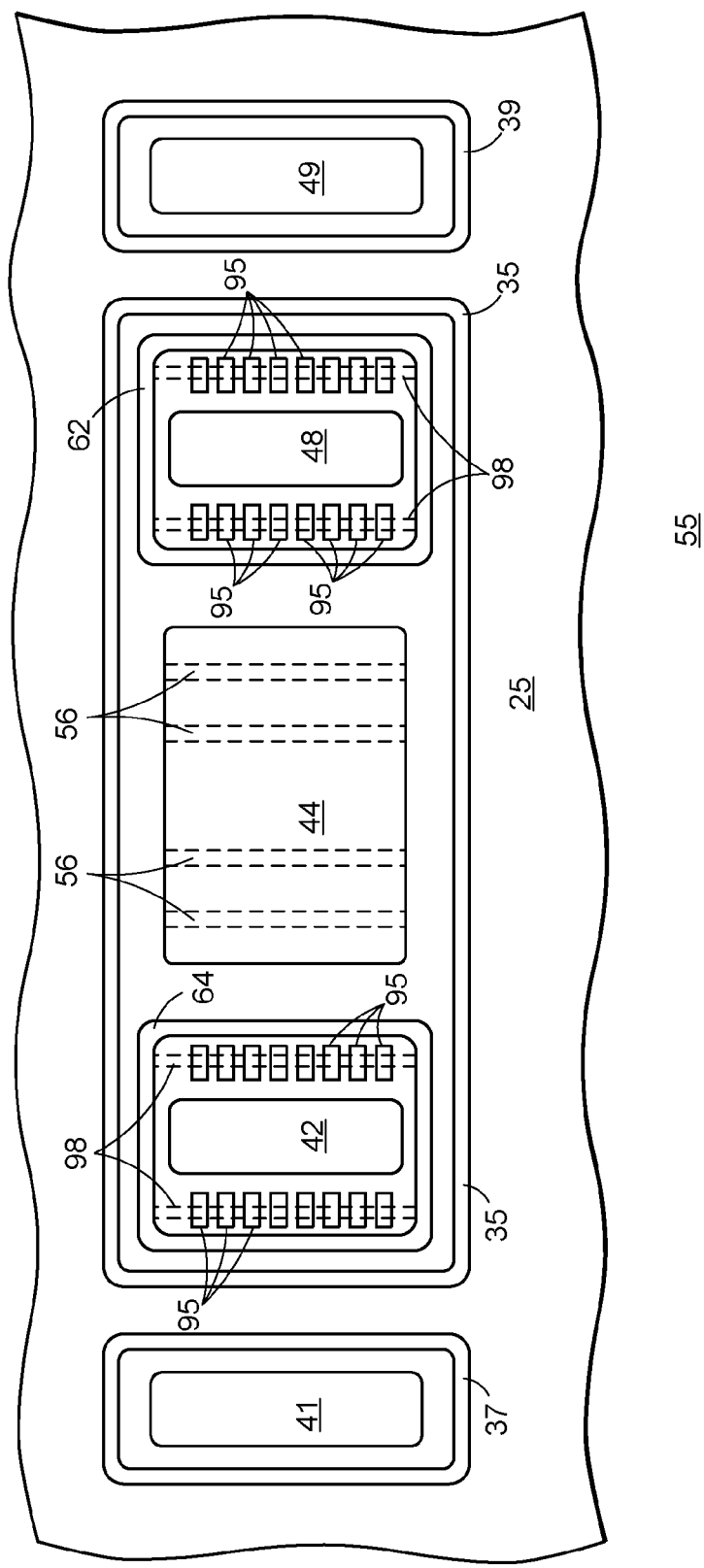
FIG. 10 illustrates an enlarged plan view of a portion of an embodiment of the ESD device of FIG. 8 and FIG. 9 in accordance with the present invention.

FIG. 10 illustrates an enlarged plan view of a portion of an embodiment of device 55. FIG. 10 illustrates device 55 prior to forming conductors 52, 53, and 54 so that the topology of device 55 may be seen. FIG. 10 illustrates that conductor 62 surrounds region 48 and conductors 95, and that conductor 64 surrounds region 42 and conductors 95. Alternately, conductors 95 may extend laterally across substrate 25 to intersect with the one of conductor 62 or conductor 64 that surrounds the particular set of conductors 95. The multiply-connected characteristic of trenches 35, 37, and 39 in addition to the multiply-connected characteristics of conductors 62 and 64 are illustrated in FIG. 10. Conductors 56 are illustrated in FIG. 10 in a general way by dashed lines.

Although the doping concentrations given for region 29 are for the preferred embodiment of a five volt (5V) breakdown voltage for respective diodes 18, 71, and 73, those skilled in the art will appreciate that the doping concentrations may have to change for other breakdown voltages. For example, for an eighty volt (80V) breakdown voltage, the doping concentration of region 29 may be decreased, or the doping concentration of substrate 25 may be decreased, or region 29 along with substrate 25 may be decreased.

Figure 11:
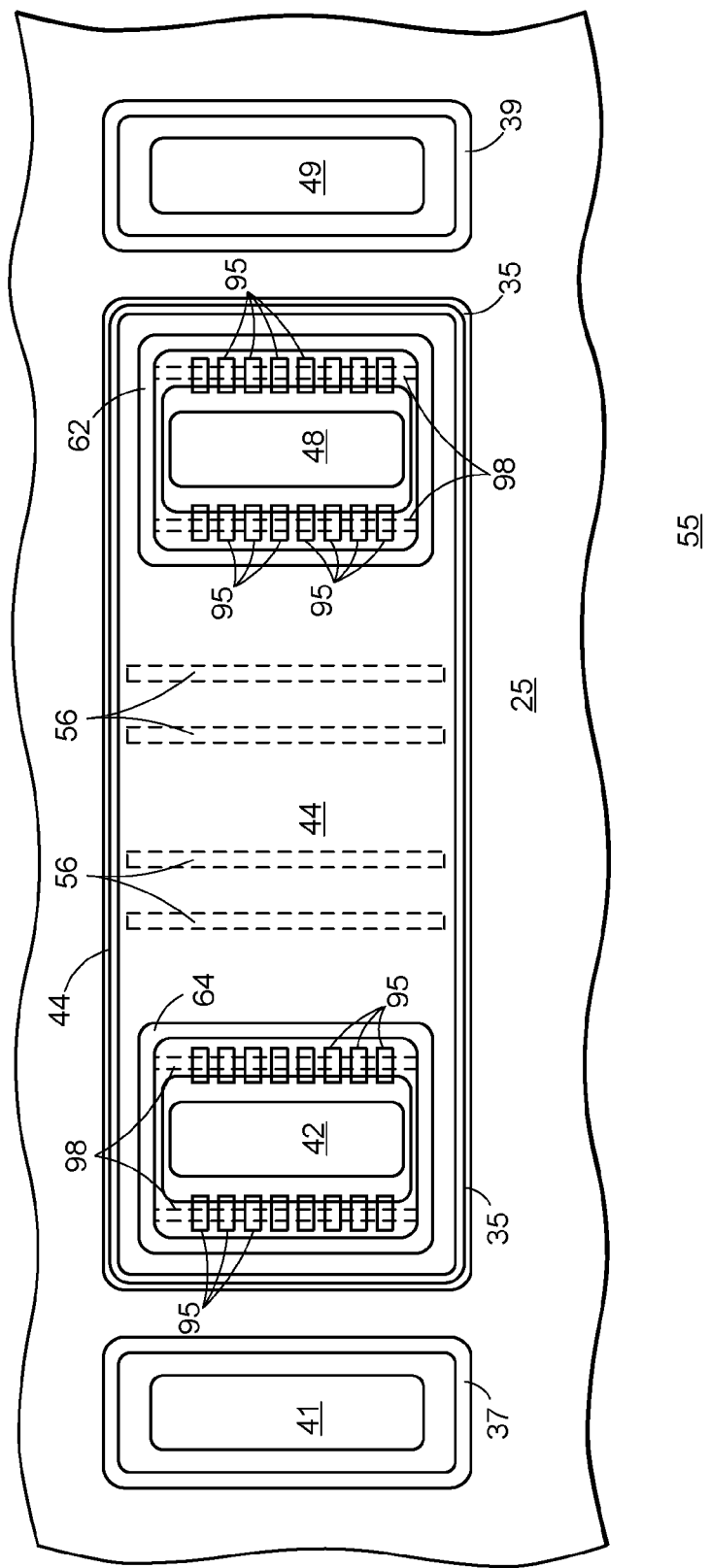
FIG. 11 illustrates an enlarged plan view of a portion of an alternate embodiment of the ESD device of FIG. 8-FIG. 10 in accordance with the present invention.

FIG. 11 illustrates an enlarged plan view of a portion of an alternate embodiment of the ESD device 55 that was explained in the description of FIG. 9 and FIG. 10. In this alternate embodiment, region 44 is formed to intersect conductors 95. Region 44 has an opening within the interior of region 44 so that region 44 does not intersect region 42 and another opening within the interior of region 44 so that region 44 does not intersect region 48. The outside periphery of region 44 typically extends to intersect trench 35. The periphery of each of the interior openings of region 44 intersect conductors 95 so that region 44 electrically connects all conductors 95 together, preferably connecting them together at least at the surface or near the surface of layer 33, thereby further reducing the resistivity. The distance from the periphery of the interior openings of region 44 and each of regions 42 and 48 should be the same as distance 96. Using a doped region formed on the surface of layer 33 with the opposite conductivity to substrate 25 to electrically connect conductors 95 together may also be used in the embodiments illustrated in FIG. 2-FIG. 3 and in the embodiment illustrated in FIG. 6.

In view of all of the above, it is evident that a novel device and method is disclosed. Included, among other features, is forming an ESD device that has a low resistance conduction path that minimizes the clamp voltage of the ESD device. Because the ESD device has a highly doped P-type substrate and a lightly doped N-type layer on the substrate, the ESD device has a low capacitance. The low resistance conduction path is added to reduce the resistance of current that would try to flow through the lightly doped N-type layer. The low resistance conduction path reduces the resistance and associated clamp voltage without increasing the capacitance of the ESD device.

While the subject matter of the invention is described with specific preferred embodiments, it is evident that many alternatives and variations will be apparent to those skilled in the semiconductor arts. For example, all the doping types may be reversed. Those skilled in the art will appreciate that trenches 37 and 39 may be removed if trench 35 remains and that trench 35 may be omitted if trenches 37 and 39 remain, and device 10 will be functional and have a low clamp voltage and have a low capacitance. Although the devices were described herein as being formed on a silicon substrate, those skilled in the art will appreciate that other semiconductor materials may be used including gallium arsenide, silicon carbide, gallium nitride, and other semiconductor materials. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming an ESD device comprising:
providing a semiconductor substrate of a first conductivity type having a first doping concentration;
forming on the semiconductor substrate a first semiconductor layer of a second conductivity type and having a first thickness and a second doping concentration;
forming a first doped region of the first conductivity type on a surface of the first semiconductor layer as a first P-N diode including forming the first doped region to have a third doping concentration that is greater than the second doping concentration;
forming a zener diode near an interface of the first semiconductor layer and the semiconductor substrate wherein a portion of the zener diode underlies the first P-N diode; and
forming a first conductor through the first semiconductor layer to conduct current from the first P-N diode to the zener diode.

2. The method of claim 1 wherein forming the first conductor includes forming the first conductor spaced a first distance from the first doped region including forming the first distance to be no greater than the first thickness.

3. The method of claim 2 wherein forming the first conductor spaced the first distance includes forming the first thickness to be approximately seven microns and forming the first distance to be less than seven microns.

4. The method of claim 1 wherein forming the zener diode includes forming a first semiconductor region of the second conductivity type positioned between a first portion of the first semiconductor layer and the semiconductor substrate wherein the first semiconductor region forms the zener diode with dopants of the semiconductor substrate.

5. The method of claim 4 wherein forming the first conductor includes forming the first conductor adjacent to the first doped region and extending through the semiconductor layer to intersect the first semiconductor region.

6. The method of claim 1 further including forming a second conductor extending from the first semiconductor layer and through the first semiconductor layer wherein the second conductor forms a multiply-connected domain that encloses the first P-N diode and the first conductor.

7. The method of claim 6 further including extending the first conductor to intersect the second conductor.

8. The method of claim 1 wherein forming on the semiconductor substrate the first semiconductor layer includes forming the second doping concentration no greater than approximately $1\times10^{17}$ atoms/cm3 and forming the first doping concentration no less than approximately $1\times10^{19}$ atoms/cm3.

9. The method of claim 8 wherein forming on the semiconductor substrate a first semiconductor layer includes forming first semiconductor layer to have a thickness that is greater than two microns.

* * * * *